United States Patent
Somasekhar et al.

(10) Patent No.: US 7,532,528 B2
(45) Date of Patent: May 12, 2009

(54) SENSE AMPLIFIER METHOD AND ARRANGEMENT

(75) Inventors: Dinesh Somasekhar, Portland, OR (US); Muhammad M Khellah, Tigard, OR (US); Yibin Ye, Portland, OR (US); Nam Sung Kim, Portland, OR (US); Vivek K De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 152 days.

(21) Appl. No.: 11/772,151

(22) Filed: Jun. 30, 2007

(65) Prior Publication Data

US 2009/0003108 A1    Jan. 1, 2009

(51) Int. Cl.
    *G11C 7/00* (2006.01)
(52) U.S. Cl. ............. 365/205; 365/63; 365/189.08
(58) Field of Classification Search ......... 365/205, 365/63, 189.08
See application file for complete search history.

(56) References Cited

U.S. PATENT DOCUMENTS

| | | | | |
|---|---|---|---|---|
| 6,956,779 | B2* | 10/2005 | Tran | 365/205 |
| 7,113,437 | B2* | 9/2006 | Schweickert et al. | 365/145 |
| 7,440,350 | B2* | 10/2008 | Obara et al. | 365/214 |
| 7,453,751 | B2* | 11/2008 | Forbes et al. | 365/207 |
| 2003/0103406 | A1* | 6/2003 | Tran | 365/230.06 |
| 2005/0105358 | A1* | 5/2005 | Schweickert et al. | 365/222 |

* cited by examiner

*Primary Examiner*—Tuan T. Nguyen
(74) *Attorney, Agent, or Firm*—Schubert Osterrieder & Nickelson PLLC

(57) ABSTRACT

A memory system having a selectable configuration for sense amplifiers is included. The memory system can include bit cells and a switch module coupled to the bit cell and to a first portion of a sense amplifier. The switch module can connect, disconnect or cross couple the bit cell to the sense amplifier based on a test for the input offset voltage of first portion of the sense amplifier. A similar configuration can be implemented by a second portion of the sense amplifier. The system can also include a programmer module to configure a setting of the switch module and can include a column select module to couple the bit cells to the sense amplifiers based on what column of bit cell is to be read. Other embodiments are also disclosed.

15 Claims, 2 Drawing Sheets

SENSE AMPLIFIER METHOD AND ARRANGEMENT

FIELD

The present disclosure is related to the field of electronics and more particularly to the field of memory systems.

BACKGROUND

Static random access memory (SRAM) is a type of electronic memory that is faster than standard dynamic RAM and does not need to be refreshed with a refresh pulse like other types of memory. SRAM is typically more expensive than other types of RAM and thus typically stores less data than dynamic RAM. SRAM is often utilized in cache memory applications. One significant advantage of SRAM is that it can be easily integrated into any CMOS logic process, hence it is typically the preferred memory choice for on-die integration with processors.

A semiconductor memory device, such as a SRAM, can be configured with bit cells that store one bit of data. The bit cells can be arranged in arrays and bit lines can connect the bit cells with a device or a sense amplifier that can read what value (a signal) that is stored in a bit cell, amplify the signal and discriminate the value stored by the memory cell to be either a logic 0 or a logic 1. The system can then transmit the logic value to a register, a processor or some other device or circuit. This read/amplify process is often performed by a sense amplifier. A typical SRAM sense amplifier can be a differential sense-amplifier consisting of cross-coupled inverters that are coupled to a pair bit-lines. A signal voltage may be developed on one of the bit-lines by the bit-cell either through actively discharging the bit-lines as in SRAMs or by charge sharing as in DRAMs.

Inherently, the pair of transistors in the sense amplifier circuit will often have a threshold voltage imbalance or a channel conductance imbalance. It can be appreciated that the offset voltage of a sense-amplifier can not be totally eliminated particularly when manufacturing thousands of silicone devices. Accordingly, the input voltage provided by the memory cell during a read operation to the sense-amplifier is effectively reduced by the offset voltage. Thus, if the stored voltage provided to the sense amplifier is less than the offset of a sense-amplifier, the memory cell cannot overcome the intrinsic offset and the sense-amplifier can resolve in the wrong direction causing an incorrect read of the value stored by the cell often called a read failure. Also, this inherent offset voltage requires a delay time to be introduced during the read to allow the stored cell voltage to swing the bit-lines to the offset voltage such that the sense amplifier will switch and an accurate read can occur.

It can be appreciated that such imbalances reduce the ability to accurately read the value stored by a memory cell. These imbalances can occur due to the systematic affects of producing a device, including the topology of manufacture and random affects such as dopant fluctuations and line edge roughness. Topology issues can be improved by careful layout of the sense-amplifiers. For example, the designer can utilize a matched common centroid style layout. Dopant fluctuations and line edge roughness cannot be eliminated since the variance of the mismatch between a pair of devices is inversely related to the gate area of the devices. Traditionally, this imbalance can be improved by increasing the area of the gate of the devices, however, this has additional negative impacts such as increased layout area. These imbalances can also create deviations in read out time and other important performance parameters.

BRIEF DESCRIPTION OF THE DRAWINGS

Aspects of the disclosure will become apparent upon reading the following detailed description and upon reference to the accompanying drawings in which, like references may indicate similar elements.

DETAILED DESCRIPTION OF EMBODIMENTS

Figure 1:
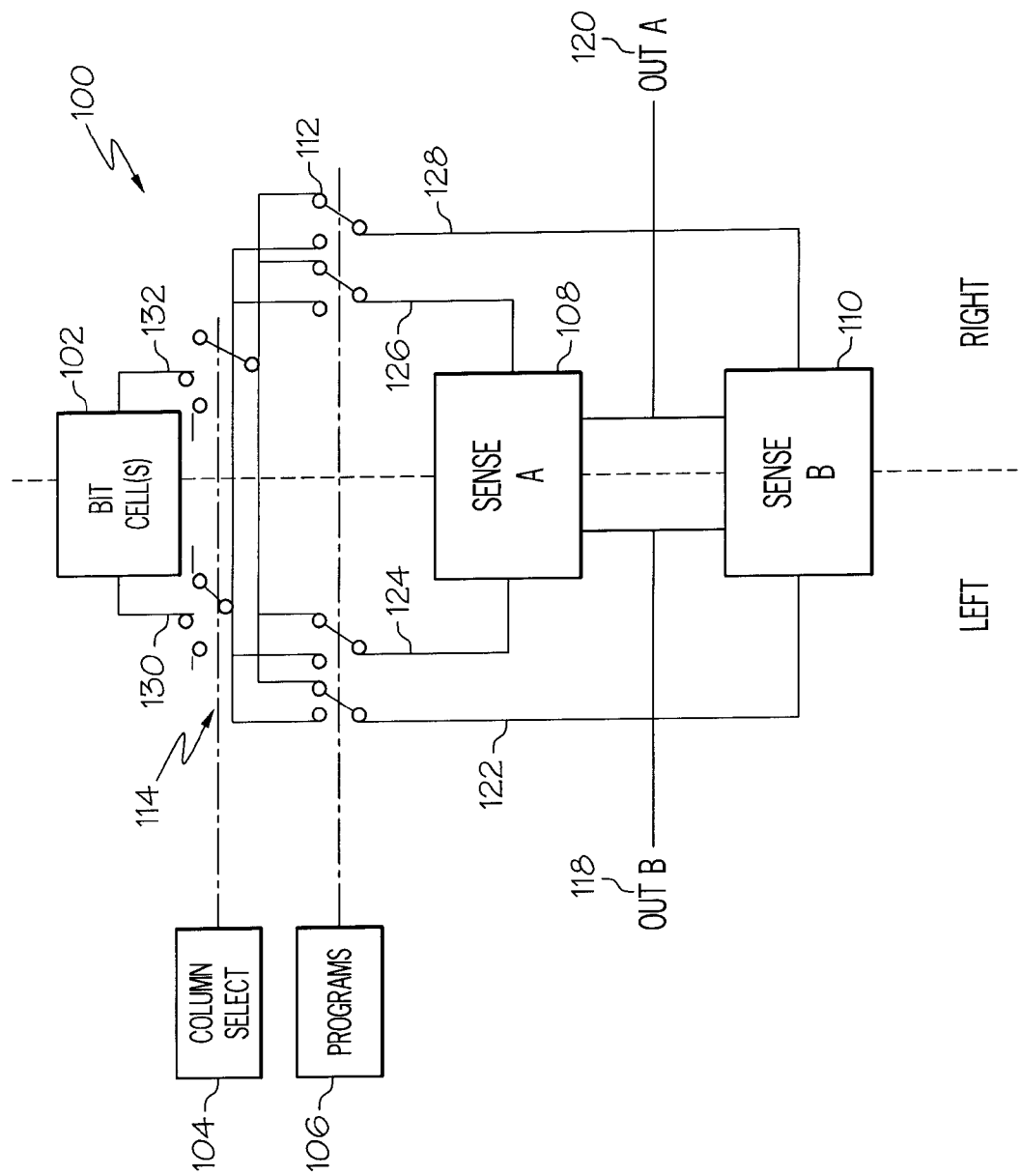
FIG. 1 depicts a block diagram of a memory system.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims. The descriptions below are designed to make such embodiments obvious to a person of ordinary skill in the art.

While specific embodiments will be described below with reference to particular configurations of hardware and/or software, those of skill in the art will realize that some embodiments of the present disclosure may advantageously be implemented with other equivalent hardware and/or software systems. Aspects of the disclosure described herein may be stored or distributed on computer-readable media, including magnetic and optically readable and removable computer disks, as well as distributed electronically over the Internet or over other networks, including wireless networks. Data structures and transmission of data (including wireless transmission) particular to aspects of the disclosure are also encompassed within the scope of the disclosure.

As discussed above, input offset voltage inherent in sense amplifiers creates significant inefficiencies and design issues in memory systems. Input offset voltage is generally proportional to the gate area of the sensing devices (i.e. the width of the transistor X and the length of the transistor Y and not the area of the silicon the devices are being manufactured from. The offset voltage of sense amplifiers on a particular integrated circuit can be viewed as a statistical parameter. For example, utilizing a 1 sigma analysis, and an offset of a sense-amplifier of 10 mV, it can be expected that approx. 60% of the sense-amplifiers have an offset less than 10 mV.

Some of the disclosed embodiments may work well with traditional SRAM configuration, however the scope of this disclosure should not be limited to such a specialized configuration and could be applied to all memory types. Thus, although embodiments are described in connection with SRAM memory, embodiments described herein may also be used for other suitable memory technology, such as a suitable dynamic random access memory (DRAM) for example. A conventional sense amplifier circuit in a SRAM array must accommodate such a statistical phenomena to determine a minimum bit line differential swing that must develop on the bit lines before the sense amplifier is clocked or activated to conduct a successful read operation.

It can be appreciated that with current technology the minimum bit line differential swing required is dictated by the worst-case input offset voltage of all the sense amps on the die due to the time required by the bit cell to drive bit lines to the worst case input offset voltage plus some safety/design margin. When the timing for the SRAM is set, the earliest that the sense amplifiers can be clocked during a read operation of a SRAM array is governed by the minimum bit line differential swing needed to ensure correct read by the sense amplifier and as stated above the minimum differential needed is dictated to a large extent by the worst-case input offset voltage of the sense-amps. Thus, a single off set amplifier with a high offset voltage can significantly slow the system and degrade system performance.

The problems identified above are in large part addressed by the systems, methods and media disclosed herein to provide a static random access memory (SRAM) with improved speed and reliability. In accordance with the present disclosure SRAM is disclosed that can include bit cells and a switch module coupled to the bit cell and to a first portion of a sense amplifier. The switch module can connect, disconnect or cross couple the bit cell top the sense amplifier based on a test for the input offset voltage of first portion of the sense amplifier. The switch module can be distinguished from a column multiplexer present in traditional designs that is utilized to connect multiple pairs of bit-line to a single sense-amplifier. The switch module can augment a multiplexer and allow the connection of the sense-amplifier in a straight, flipped or unconnected fashion.

A substantially identical configuration can be achieved with a second portion of the amplifier. The system can also include a programmer module to configure a setting of the switch module and a column select module to couple the bit cells to the sense amplifiers based on what column of bit cell is to be read. Thus, the first and second portion of the sense amplifiers can be configured in a coupling configuration a cross coupling configuration or a decoupling configuration.

In another embodiment, a method of configuring a memory system is disclosed. The method can include setting a bit cell with a bit of data, clocking the bit of data from the bit cell to a sense amplifier, determining an indicator of a performance of the sense amplifier, and altering an interconnection between the sense amplifier and the bit cell in response to the indicator.

Referring to FIG. 1, a portion of a static random access memory SRAM system 100 with selectable sense amplifier configurations is disclosed. The system 100 can include a plurality of bit cells, illustrated by bit cell 102, a switch module 112, sense amplifier A 104, sense amplifier B 106, column selector 104, programmer module 106, and column select switches 114. In accordance with traditional configurations column select switches 114 could be implemented by a multiplexer.

The column select switches 114 are illustrated in a series configuration with sense amp configuration switches 112 to simplify the description/illustration herein. However in one embodiment the column select switches 114 and the sense amp configuration switches can be integrated together to reduce then number of switches required. Sense amplifier A 108 can be a portion of a complete sense amplifier and sense amplifier B 110 can be a portion of the same sense amplifier or a stand alone amplifier.

Bit lines 122, 124, 126, 128, 130 and 132 can carry a differential voltage and a relatively small current from the plurality of bit cells 102 to the sense amplifiers 108 and 110. The change in voltage that occurs on bit lines between a logic high and a logic low when bit cell 102 forces a voltage onto bit lines 122-132 can be referred to as bit line voltage swing. A larger bit line swing allows SRAM memory 100 to achieve a faster read cycle and achieve lower error rates when reading data from the bit cell 102 or when reading the voltage on the bit lines. Bit line voltage swing is particularly important when data is retrieved from the bit cell 102 during a read operation.

The differential sense-amplifier structure 108 and 110 can be comprised of two amplifying transistors. The sense-amplifier output nodes 118 and 120 can be coupled to input nodes or the sense amplifiers 108 and 110 and can form a cross-coupled inverter loop. Two cross-coupled N type metallic oxide semiconductor (NMOS) devices can act as amplifiers and two cross-coupled P type MOS devices can act to restore the cell to the appropriate voltage level after a read. The inverter loop can be coupled to bit-lines 122-132 which can be pre-charged to Vcc by a pair of isolating devices such as PMOS devices. The sense-amplifiers 108 and 110 can be disconnected from the Vss rail by an additional tail current device (NMOS) which is turned off.

One bit-line can act as a reference and can provide a voltage level that can be compared to the voltage of the other bit-line. During the read process, the cross-coupled inverter pairs in the sense amplifiers 108 and 110 can be deactivated such that it does not interfere with the signal development on the bit lines formed by the bit cell 102. Subsequently the inverter loop can be energized. The inverter loop can amplify the small difference in voltage between the signal and reference bit-lines. Since this can be a regenerative structure, the cell 102 can latch the value on the signal bit-line as either a zero or a one.

In accordance with the present disclosure, two portions of sense amplifiers (i.e. A and B 108 and 110) can be connected in a user selectable interconnect configuration via switch module 112. Switch module 112 can be fabricated utilizing transistors configured in AND gate configurations. In one embodiment, the sense amplifiers A and B 108 and 110 can be complete sense amplifiers and in another embodiment the sense amplifiers A 108 and B 110 can half of a traditional cross coupled inverter sense amplifier. Thus, sense amplifiers 108 and 110 can be a traditional amplifier design that is "split" into two parts.

It can be appreciated that after an integrated circuit is manufactured, one portion of the sense amplifier might have an input offset voltage such that it takes a relatively large voltage differential across its input terminals to toggle the sense amplifier. Thus, if a lower voltage is stored by the bit cell 102 the sense amplifier may not toggle and a system error can occur. During operation, the sense amplifiers 108 and 110 can "recreate" the signal provided by the bit cell 102 on node 120 OUT A and node 110 OUT B.

As discussed above, sense amplifiers can have a high input offset voltage that has an opposite polarity of the stored bit and the process of reading data from memory (i.e. bit cells 102) must be performed relatively slowly because the bit cell 102 must "charge up" one bit line and "de-charge" the other bit line to a voltage level to at least the input offset voltage of the sense amplifiers 108 and 110 before the sense amplifiers 108 and 110 will toggle. If the input offset voltage is too high, the bit cell 102 may not be able to achieve such a voltage differential resulting in read failure. Alternately, it can take a relatively long time for a bit cell to create a voltage differential on the bit lines such that a sense amplifier with a large input offset voltage will toggle and this diminishes the speed at which the SRAM can operate.

In one embodiment, compensation for input offset voltages of individual sense amplifiers can be made after the integrated circuit is fabricated or "post silicon." Such compensation can be achieved by testing the sense amplifier to determine a polarity and magnitude of the off set voltage and configuring switches 112 with programmer module 106 to compensate for such an offset. Such offset voltage compensation can be accomplished utilizing many different switching configurations. In one embodiment, a sense amplifier that has a high input offset voltage can be disconnected from the bit lines or "deactivated" while a "spare" sense amplifier is substituted in its place. This can eliminate the "worst case" devices and hence the memory can be run at higher speeds.

In another embodiment a nominal sense amplifier can be coupled in a standard configuration and two sense amplifiers can be cross coupled when the polarities of the input offset of the sense amplifiers provides improved performance. Thus, depending on the input offset voltage of a sense amplifier, such as sense amplifier A 108 and B 110, sense amplifiers can be coupled such that they can sense differential data from both sides of a bit cell with a lower minimum voltage levels required by the bit cell 102 and on the bit lines 122-132. It can be appreciated that the ability to sense lower voltages and sense voltages quicker from the bit cell 102 in a SRAM circuit can significantly improve memory performance.

The sense amplifier can be made in two or more parts were the input polarity of each part might be different. As stated above, input offset voltage is generally a function of the width or area of the silicon devices (sense amplifiers 108 and 110). Splitting the amplifiers 108 and 110 into two sections can reduce the width of the silicon and further reduce the input offset voltage of each amplifier 108 and 110.

In one configuration the sense amplifiers 108 and 110 may have an input offset voltage that is of an opposite polarity and when this occurs the sense amplifiers 108 and 110 can be cross coupled by the programmer 106 during a post-silicon or post manufacturing state such that improved read margins/memory performance can be achieved. The programming or interconnection of the sense amplifiers 108 and 110 can be done to minimize the effective input offset voltage, and thus reduce the minimum bit line differential voltage needed for a read cycle to occur.

To perform the post silicon programming procedure that is based on the input offset voltages of the sense amplifiers 108 and 110 the input offset voltage can be determined utilizing a "pre-charging" circuit. This circuit can be the same circuit that is also utilized to pre-charge the bit lines. To determine what the input offset voltage is and what switching configurations should be implemented by the switch module 112 to improve the performance of the memory system different "precharge" levels can be supplied to the sense amplifier and then the output voltage of the sense amplifiers can be read to determine approximately the offset voltage of each sense amplifier. The pre-charge setting that triggers the sense amplifiers 108 and 110 to flip can be stored as a digital or two bit indicator that indicates an input offset voltage of either the first portion of the sense amplifier, a second portion of the sense amplifier or both.

This indicator can also be determined by clocking one or both sense amplifiers at various times after the bit cell starts to pull the voltage on the bit lines and comparing an output value of the sense amplifier to the value stored by the bit cell. Clocking the sense amplifier early (i.e. reducing the time from word-line firing to the sense-amplifier activation) can cause a reduction in the signal applied to the sense-amplifier and hence can be utilized to detect input offset voltage. Thus, during the initialization procedure the clock can be strobe/clock at different times and the longer the delay required by the clock to achieve a correct read, is an indicator that the offset voltage has an opposite polarity and is greater. Many time/pre-charge voltage combinations and many different switching configurations for each amplifier can be tried during the initialization procedure, where the switched configuration that creates the "fastest" read time for reading a logic high and a logic low.

In one embodiment a pair of indicator bits can be utilized for each sense-amplifier. The bits can control a connected state, a disconnected state and connected but flipped or cross coupled state. The number of indicator bits can be reduced by noticing that only 3 states are represented by the 2 bits (while it is possible to represent 4 states with two bits). For example utilizing a pair of sense-amplifier switch modules A and B there can be four conditions:
1) A only connected;
2), B only connected;
3) A and B connected normally; and
4) A and B connected flipped.

Thus, two indicator bits can represent the switch settings for each sense amplifier. However utilizing two indicator bits per sense-amplifier pair can be cumbersome and expensive both in terms of area as well as test time. Accordingly, because there will typically be only a limited number of sense-amplifiers have this "worst case offset", the worst case amplifiers can share a status or bits can be shared across groups of sense-amps. In one embodiment the entire group of worst case sense amplifiers can get programmed identically by just one pair of bits as each amplifier is addressable by the system. The aim of this embodiment would be to reduce the offset of the group as a whole or the system as a whole. Such a configuration may only guarantee reduction of offset in a statistical sense, as it can be appreciate that each configuration, (i.e. flipped, normal, A connected, B connected) each have a particular sense-amp becoming the worst case sense-amp. As stated above the interconnection between bit cells and sense amplifiers can be altered during power up or even during idle times where altering the interconnection can include normal coupling, cross coupling and decoupling portions of the sense amplifiers.

The input terminal pair of each sense amplifier 108 and 106 can be connected in at least three configurations. In one configuration, referred to here in as the "standard" configuration, the left terminals 122 and 124 of the sense amplifiers 108 and 110 can be connected to the left bit line 130, and the right terminals 126 and 128 of the sense amplifiers 108 and 110 can be connected to the right bit line 132. In a "swapped" configuration, the left terminals 122 and 124 of sense amplifiers 108 and 110 can be connected to the right bit line 132, and the right terminals 126 and 128 of sense amplifiers 108 and 110 can be connected to left bit line 130.

In yet another configuration, referred to as a "disconnected" configuration one, or both sense amplifiers 108 and 110 can be disconnected from the plurality of bit cells 102. This configuration can be utilized if, or when, a sense amplifier has a large input offset voltage or some other defect or functional problems. Generally, one or both sense amplifiers 108 and 110 can be disconnected from the plurality of bit cells and hence disabled. Such a feature can select the highest performing sense amplifiers and provide much improved SRAM memory performance.

In the illustration, only one memory column is illustrated with a single bit cell. However, it can be appreciated that a memory can be configured in an array with columns and rows of bit cells where millions of bit cells are connected to thousands of sense amplifiers, column select modules and numerous programmer modules. Thus, programmer module 110 can control the interconnection of many different sense amplifiers across many different columns to reduce the area required to implement the devices described in this disclosure. Such minimization can also reduce other overhead such as power consumption. The disclosed embodiments will significantly improve the effective input offset problems of SRAM designs. A two part sense amplifier (i.e. 108 and 110) can significantly reduce input offset voltage with minimal expense and control area overhead.

On additional advantage in being able to configure the sense amplifiers 108 and 110 after the SRAM is fabricated is that the polarity and magnitude of the input offset voltage typically cannot be determined without testing the sense amplifier in the integrated circuit. It be possible and configured such that one sense amplifier, for example sense amplifier A 108, has a positive input offset voltage and sense amplifier B 110 has a negative input offset voltage such that the proper switched configuration provides faster read times. In one embodiment, programming goals can include balancing input offset voltage of the two sense amplifiers and minimizing the effects of the effective input offset voltage as seen by the left and right bit lines.

In one example, when two sense amp parts are utilized, and both have a positive input offset (as seen from the left bit line), sense amplifier A 108 can be connected in the standard configuration (left bit line 130 to left terminal 124), and sense amplifier 110 can be configured in the swapped mode where the left bit line 130 can be connected to the right terminal 128 and the right bit line 132 can be connected to the left terminal 122. This connection configuration provides a reduced effective input offset for both the left and right bit lines. Thus, when both sense amplifiers 108 and 110 have the same input offset voltages one sense amplifier's connections can be inverted to reduce the effective offset voltage.

When the sense amplifier with the smaller input offset voltage toggles based on the values on the bit lines the other sense amplifier with the larger input offset voltage will also toggle based on the currents and voltages on the conductors interconnecting the sense amplifiers 108 and 110. Such an ability to configure the sense amplifiers 108 and 110 can significantly reduce the amount of bit line swing required to create an effective read of the bit cell value by the sense amplifier. Without switching one of the sense amplifiers or changing its input offset voltage polarity with respect to the left bit line, as in a conventional non selectable interconnection scheme, the worst-case offset is much larger as seen from the left bit line in the above example.

It can be appreciated that the effect of higher offset voltages can be reduced by the arrangements disclosed herein having a selectable dual sense amplifier configuration. Accordingly, reducing the minimum bit line voltage differential required to switch the sense amplifier can be reduced the access time for the data contained in the bit cells and a valid sense amplifier output can be achieved even when the sense amp is clocked or activated earlier in a read cycle. Such a configuration improves the read time or read cycle and the system can operate at higher speeds. Such an improvement can improve SRAM cycle times for SRAMS that are part or microprocessor circuits or for stand-alone SRAM integrated circuits/designs. As stated above, the selectable interconnect configuration of sense amplifiers in SRAM arrays allows post-silicon programming to configure a SRAM design for improved performance.

Figure 2:
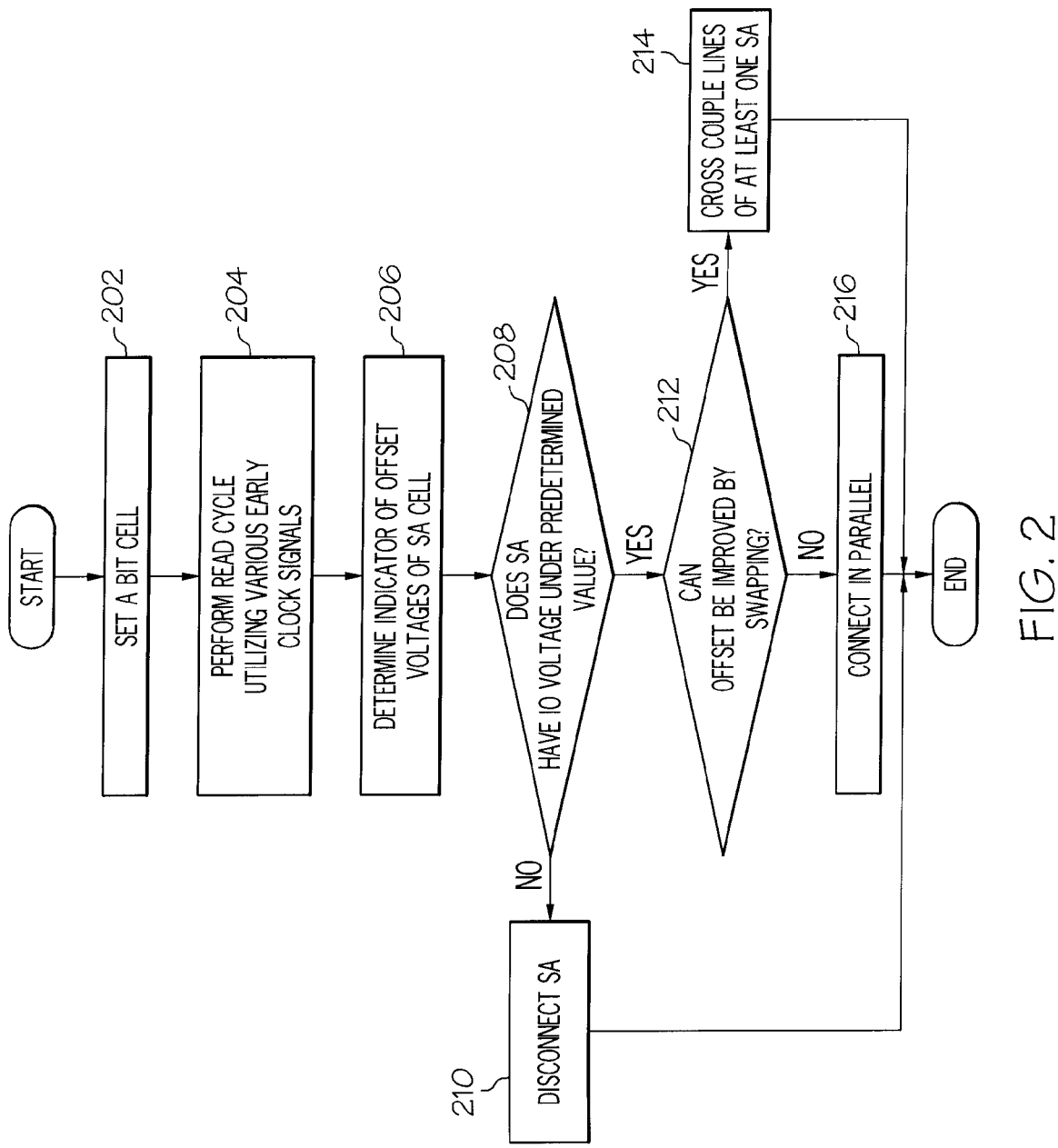
FIG. 2 illustrates a flow diagram of a method for testing and configuring sense amplifiers for a memory system.

Referring to FIG. 2, a flow diagram for a post-silicon programming method is illustrated. The disclosed method can minimize the effects of input offset voltages that occur in sense amplifiers by selectively interconnecting sense amplifiers with bit cells. As illustrated by block 202, a bit cell can be set to a value. As illustrated by block 204, pre-charge voltages, various bit cell voltages and sense amplifier clocking variations can be utilized to get an indication of the input offset voltage of the sense amplifier as illustrated by block 206. Based on the indication, it can be determined if the sense amplifier is useable by the system as illustrated by decision block 208.

If it is determined that the sense amplifier is not useable (or is in a group of underperforming amplifiers, these "worst case' or underperforming amplifiers can be removed from the system. These sense amplifiers can be disconnected as illustrated in block 210 and the process can end thereafter. Eliminating a select few underperforming amplifiers may allow a memory to operate at much higher speeds without errors.

When it is determined that the bit cell is useable then it can be determined if the input offset voltage can be improved by changing the interconnection of the sense amplifier to the bit cell, as illustrated by decision block 212. If the offset or read time can be improved then the lines of the sense amplifiers can be cross-coupled as illustrated by block 214. If the offset cannot be improved as illustrated by decision block 212 the amplifiers can be connected in parallel as illustrated in block 216. Thus, the switching configuration can be selected based on which switch configuration provides the best read performance.

If the input offset voltage can be improved by cross coupling or swapping then the sense amplifiers can be cross coupled or swapped as illustrated by block 214 and the process can end thereafter. In block 212 if the input offset voltage issue cannot be improved by cross coupling or swapping then the sense amplifiers can be connected in parallel as illustrated in block 216 and the process can end thereafter.

Each process disclosed herein can be implemented with a software program. The software programs described herein may be operated on any type of computer, such as personal computer, server, etc. Any programs may be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet, intranet or other networks. Such signal-bearing media, when carrying computer-readable instructions that direct the functions of the present disclosure, represent embodiments of the present disclosure.

The disclosed embodiments can take the form of an entirely hardware embodiment, an entirely software embodiment or an embodiment containing both hardware and software elements. In some embodiments, the disclosed subject matter may be implemented in software, which includes but is not limited to firmware, resident software, microcode, etc. Furthermore, some embodiments can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The control module can retrieve instructions from an electronic storage medium. The medium can be an electronic, magnetic, optical, electromagnetic, infrared, or semiconductor system (or apparatus or device) or a propagation medium.

Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. A data processing system suitable for storing and/or executing program code can include at least one processor, logic, or a state machine coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

It will be apparent to those skilled in the art having the benefit of this disclosure that the present disclosure contemplates methods, systems, and media that can automatically tune a transmission line. It is understood that the form of some of the embodiments shown and described in the detailed description and the drawings are to be taken merely as examples. It is intended that the following claims be interpreted broadly to embrace all the variations of the example embodiments disclosed.

What is claimed is:

1. A memory system comprising:
   a bit cell having a first output node and a second output node;
   at least a first portion of a sense amplifier having a first input, a second input and a first and second output, the at least a first portion of the sense amplifier having an input offset voltage;
   a switch module coupled to the bit cell and the at least a first portion of the sense amplifier, the switch module to selectively couple the first and second output node of the bit cell to the first and second input of the first portion of the sense amplifier, the selective coupling based on the input offset voltage.

2. The system of claim 1, further comprising a second portion of a sense amplifier coupled to the switch module, the second portion of the sense amplifier selectively connectable to the at least one bit cell in response to an input offset voltage of the second portion of the sense amplifier.

3. The system of claim 2, wherein coupling one of the at least first portion of a sense amplifier or the second portion of the sense amplifier to the bit cell comprises a cross coupling configuration.

4. The system of claim 2, wherein coupling one of the at least first portion of a sense amplifier or the second portion of the sense amplifier to the bit cell comprises a decoupling configuration.

5. The system of claim 2, wherein coupling one of the at least first portion of a sense amplifier and the second portion of the sense amplifier to the bit cell comprises a straight coupling configuration.

6. The system of claim 1, further comprising a programmer module to configure a setting of the switch module based on the offset voltage of the at least a first portion of the sense amplifier.

7. The system of claim 1, further comprising a programmer module to configure a setting of the switch module based on an offset voltage of the second portion of the sense amplifier.

8. The system of claim 1, further comprising a column select module to couple the bit cell to the at least first portion of the sense amplifier.

9. A method of configuring a memory system comprising:
   setting a bit cell with a bit of data;
   clocking the bit of data from the bit cell to at least a portion of a sense amplifier;
   determining an indicator of a performance of the at least a portion of the sense amplifier; and
   altering an interconnection between the at least a portion of the sense amplifier and the bit cell in response to the indicator.

10. The method of claim 9, further comprising pre-charging at least one bit line of the bit cell.

11. The method of claim 9, wherein the indicator is associated with an input offset voltage.

12. The method of claim 9, wherein the indicator comprises an indicator associated with a first portion of a sense amplifier and a second portion of a sense amplifier.

13. The method of claim 9, wherein determining comprises clocking the at least a portion of the sense amplifier at various times to determine if data can be accurately read.

14. The method of claim 13, wherein determining comprises comparing an output value of the at least a portion of the sense amplifier to a value that represent a bit cell value.

15. The method of claim 9, wherein altering the interconnection comprises one of cross coupling the at least a portion of the sense amplifier or decoupling the at least a portion of the sense amplifier.

* * * * *